United States Patent [19]

Takahashi

[11] Patent Number: 4,544,893
[45] Date of Patent: Oct. 1, 1985

[54] BATTERY VOLTAGE DETECTOR

[75] Inventor: Hiroshi Takahashi, Yokohama, Japan

[73] Assignee: Canon Kabushiki Kaisha, Tokyo, Japan

[21] Appl. No.: 408,595

[22] Filed: Aug. 16, 1982

[30] Foreign Application Priority Data

Aug. 28, 1981 [JP] Japan ................... 56-135073

[51] Int. Cl.⁴ ............................................. G01N 27/46
[52] U.S. Cl. ..................................... 324/433; 324/435;
340/636
[58] Field of Search ............... 324/426, 433, 133, 435,
324/429; 340/753, 661, 636, 715; 354/468, 475

[56] References Cited

U.S. PATENT DOCUMENTS 4,203,103 5/1980 Osada et al. ................... 340/636

Primary Examiner—Ernest F. Karlsen
Assistant Examiner—Kevin D. O'Shea
Attorney, Agent, or Firm—Fitzpatrick, Cella, Harper & Scinto

[57] ABSTRACT

A device for detecting a voltage of a battery for use in electronic apparatus and appliances, the detector being constructed with a display device which include segments to display input data and processed data and segments to display particular data; a time-division signal output device to produce time-division output signals for driving the display device in a time-division mode; a voltage detector to detect a voltage of a source battery in synchronism with the time-division output signals from the time-division signal output device; a voltage comparator to compare the battery voltage as detected by the voltage detector with a reference voltage; and a segment driver to drive the segments which have been pre-selected from the segments in the display device based on the result of comparison by the voltage comparator.

17 Claims, 9 Drawing Figures

BATTERY VOLTAGE DETECTOR

BACKGROUND OF THE INVENTION

1. Field of the Invention

This invention relates to a device for detecting a voltage of a battery used in electronic apparatus and appliances, the circuit of which is driven in part or whole by a battery, and for displaying a voltage condition as detected.

1. Description of Prior Art

There have so far been proposed several systems for detecting a voltage of a power source such as, for example, a battery to be used for electronic apparatus and appliances such as electronic desk calculators, etc. One example of such battery voltage detecting system reads the voltage of a battery to be used with an AD converter, etc., and feeds the read-out data into a control circuit, a CPU, and so forth of the electronic apparatus, the battery voltage being indicated by the control circuit, or directly by a voltmeter, or by a liquid crystal display device, in which the data display changes its density depending on a level of voltage due to the voltage dependent property of liquid crystal. Such system of indicating the battery voltage through the control circuit, however, imposes more load on the control circuit, and further necessitates high-priced component parts such as the AD converter, etc., on account of which the system is not entirely satisfactory for the battery voltage detection. On the other hand, the system of using the voltmeter, etc., has shortcomings such that an exclusive circuit other than the control circuit is used, or the voltage data are constantly on display even when they are not needed, which is troublesome to the eyes of an operator.

SUMMARY OF THE INVENTION

It is an object of the present invention to provide a battery voltage detector which is simple in circuit construction, and is capable of notifying an operator of a voltage condition of a battery through display, only when it is necessary to do so, without imposing unnecessary load on a control circuit.

It is another object of the present invention to provide a battery voltage detector which is capable of notifying an operator of the electronic apparatus of a voltage condition of a battery by first detecting a voltage of the battery in use in synchronism with a numerical place driving signal of a display device, and then causing a particular segment in the display device to be lighted when the detected voltage is lower than a reference value.

The foregoing objects, other objects as well as the specific construction, function, and resulting effect of the battery voltage detector according to the present invention will become more apparent and better understood from the following detailed description of a preferred embodiment thereof, when read in conjunction with the accompanying drawing.

DETAILED DESCRIPTION OF PREFERRED EMBODIMENT

Figure 1:
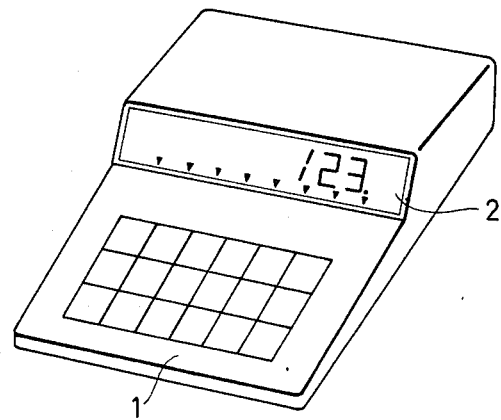
FIG. 1 is a perspective view showing an outer appearance of an electronic desk calculator, in which the present invention is put into practice.

Referring now to FIG. 1 showing an external appearance of an electronic desk calculator, in which the present invention has been put into practice, a reference numeral 1 designates a keyboard having therein a plurality of numerical keys for input of numerical values, and function keys to give directions for operations of the four arithmetic rules; and a numeral 2 refers to a display device for indicating numerical values as input from the keyboard 1, results of the operations with respect to the input numerical values, and a voltage condition of the battery.

Figure 2:
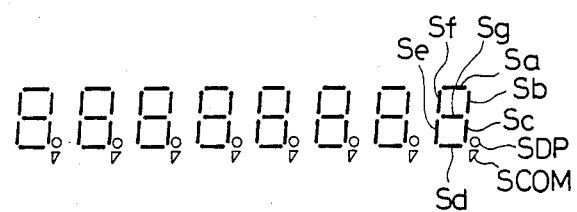
FIG. 2 is a diagram for explaining a segment construction of the display device shown in FIG. 1.

FIG. 2 is a diagram for explaining construction of segments in the display device shown in FIG. 1. As seen, the display device is made up of eight numerical places, each place being composed of segments $S_a$ through $S_g$, a decimal point segment $S_{DP}$, and a segment $S_{COM}$ for indicating the state of battery voltage in accordance with the present embodiment. While the segment $S_{COM}$ is for indicating position of figures at every three places in general, it is also used, in this embodiment, for indicating the voltage condition of the battery as detected. By the way, the display device as used in the present embodiment is an 8-place LED display device which is well known in general, each numerical place therein being driven by a time-division signal. In more detail, when the place signal assumes a high level, and the segment signal takes a low level, the segments of numerical place (or places) as selected give out light.

Figure 3A:
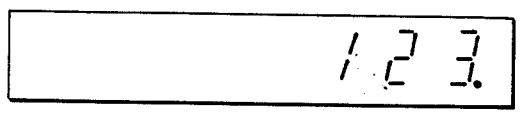
FIGS. 3A, 3B and 3C are respectively diagrams showing a state of numerical displays in a device according to an embodiment of the present invention.
Figure 3B:
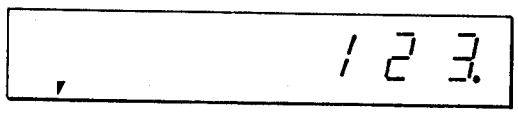
Figure 3C:
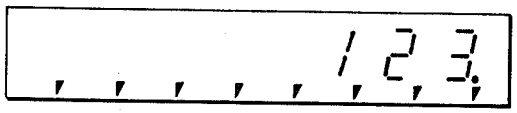

FIGS. 3A, 3B and 3C respectively indicate the voltage condition of the battery to be displayed on the above-mentioned display device. In more detail, FIG. 3A shows a case, wherein the battery at use is in full capacity, and no segment $S_{COM}$ is lighted at all to indicate the condition. FIG. 3B shows a case, wherein one of the segments $S_{COM}$ is lighted to call the attention of an operator to the fact that the battery capacity is becoming low, and exchange of the battery is needed. FIG. 3C shows a case, wherein all the segments $S_{COM}$ are lighted to make the operator conscious of the fact that the battery capacity has become lower than the voltage value which is needed, and that no regular operations of the electronic apparatus can be carried out without replacement of the battery.

Figure 4:
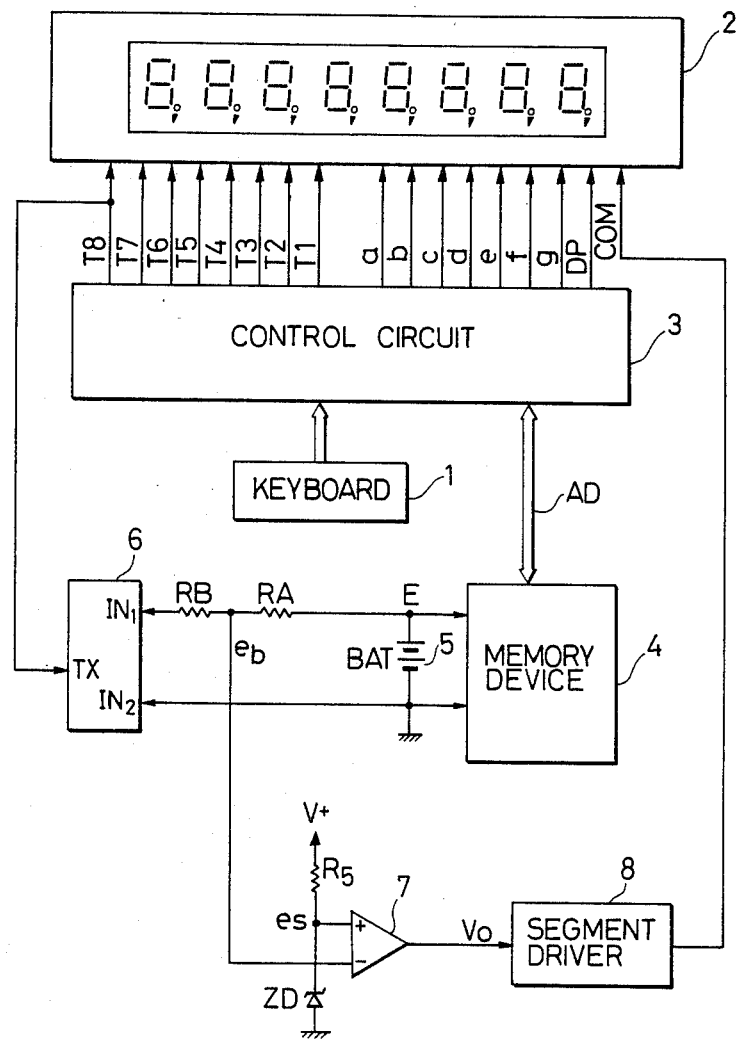
FIG. 4 is a block diagram showing a circuit construction of the preferred embodiment of a battery voltage detector according to the present invention.

FIG. 4 is a block diagram showing a construction of the battery voltage detecting device according to the present invention. In the drawing, a reference numeral 2 designates the display device using LEDS (light emitting diodes); a numeral 3 refers to a control circuit to take all control of the functions of the electronic desk calculator according to this embodiment, which carries out predetermined operations in pursuance of input signals from the keyboard 1, and sends out to the display device 2 the time-division, numerical place driving signals $T_1$ to $T_8$, the segment driving signals a to g, and the decimal point driving signal DP to thereby display the results of the operations; and a reference numeral 4 designates a memory device connected with the control circuit 3 by means of a signal line AD. The signal line AD is made up of addresses signal lines to put address of the data on one part of the memory device, and data lines to convey the data thereon. The memory device 4 is so constructed that it is driven by a battery BAT 5 to protect the data in it, even when disconnection of the main power source for the control circuit takes place.

The signal $T_8$ of the numerical place driving signals $T_1$ to $T_8$ in the display device 2 is also sent to a circuit 6, in addition to the display device 2. The circuit 6 does switching operations causing electric current to be conducted to the battery BAT 5 through resistors RA, RB when the time-division, numerical place driving signal output $T_8$ for the eight place is produced from the control circuit 3. More detailed description of this circuit 6 will be given later.

A reference numeral 7 designates a voltage comparator, the positive (+) input of which receives a reference voltage $e_s$ to be fixed by a Zener diode ZD, and the negative (−) input of which receives a voltage $e_b$ at the connection between the above-mentioned resistors RA and RB. When the voltage $e_b$ is higher than the reference voltage $e_s$ applied to the positive input side of the voltage comparator 7, an output signal Vo from the voltage comparator is at a high level. On the other hand, when the voltage $e_b$ is lower than the reference voltage $e_s$, the output signal Vo is at a low level. By the way, the reference voltage $e_s$ has the minimum voltage value which is able to ensure regular driving of the electronic apparatus. A numeral 8 refers to a segment driver to actuate the segments $S_{COM}$ in the display device 2, which receives an output signal Vo from the voltage comparator 7 as an input. When the signal Vo is at a high level, an output signal COM assumes a low level to thereby put the segments $S_{COM}$ in a condition of being ready for lighting.

Figure 5:
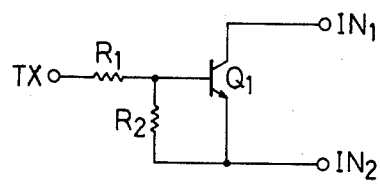
FIG. 5 shows a construction of a switch circuit.

In the following, a detailed explanation will be given of the switch circuit 6 in FIG. 5.

The above-mentioned time-division, numerical place driving signal $T_8$ is sent into an input terminal Tx. That is to say, when the input terminal Tx is at a high level, electric current goes through the base of a transistor $Q_1$ by way of a resistor $R_1$ causing the transistor $Q_1$ to be turned on, whereby outputs $IN_1$ and $IN_2$ are put in condition for current conduction. In other words, a closed circuit is formed with the switch circuit 6, the resistor RB, the resistor RA, and the battery BAT 5 in the order as mentioned. By the way, a resistor $R_2$ is for biassing the base of the transistor $Q_1$. On the other hand, when the input terminal Tx is at a low signal level, the transistor $Q_1$ is in condition for being turned off, on account of which the outputs $IN_1$ and $IN_2$ are put in an open condition. In other words, the circuit formed with the switch circuit 6, the resistor RB, the resistor RA, and the battery BAT 5 becomes open.

Figure 6:
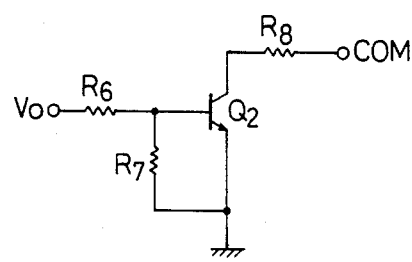
FIG. 6 shows a construction of a segment driver.

FIG. 6 shows a circuit diagram for explaining details of the segment driver 8 in FIG. 4. When the output signal Vo from the voltage comparison circuit 7 is at a high signal level, current is conducted to the base of the transistor $Q_2$ through a resistor 6 turning the transistor on, and the segment driving signal COM takes a low level. In this condition, the segments $S_{COM}$ become ready for lighting. On the other hand, when the output signal Vo from the voltage comparison circuit is at a low signal level, the transistor $Q_2$ is in the "off" condition, and the segments $S_{COM}$ are put in a non-lighting condition. By the way, a resistor $R_8$ is for limiting current in the liquid crystal display device 2, and a resistor 7 is for biassing the base of a transistor $Q_3$.

In the following, operations of the battery voltage detecting device of the above-mentioned construction will be explained in detail with reference to a timing chart of FIG. 7.

Figure 7:
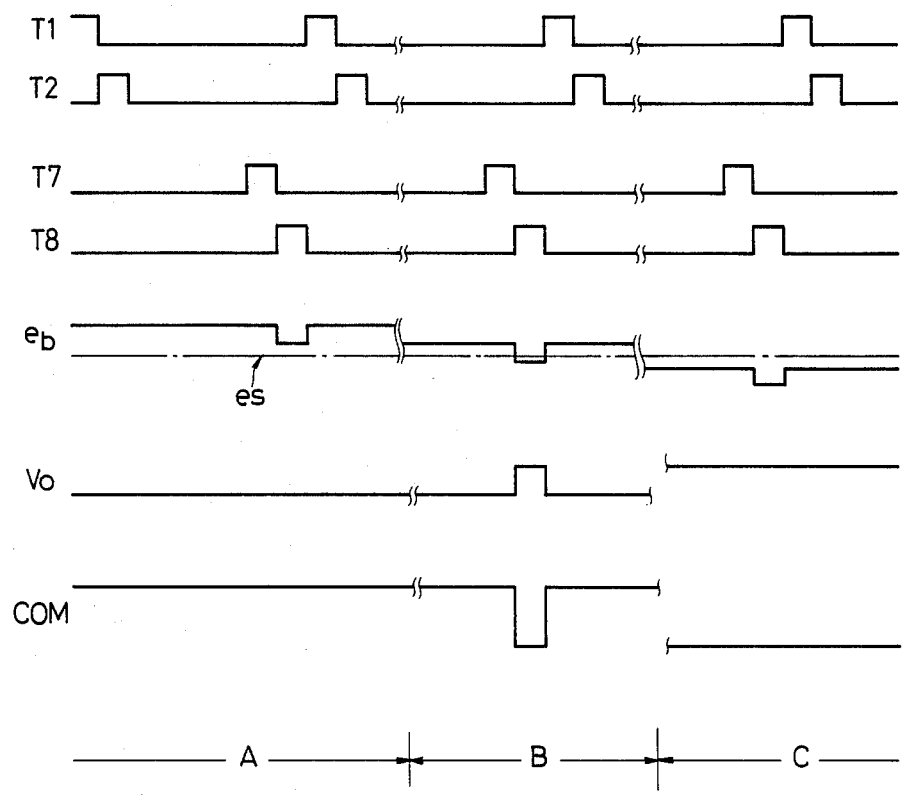
FIG. 7 is a timing chart.

First of all, a section A in FIG. 7 shows a condition where the battery is in full capacity. As mentioned in the foregoing, when the voltage $e_b$ at the negative (−) input side of the voltage comparator 7 is lower than the reference voltage $e_s$ at the positive (+) input side, the segments $S_{COM}$ are lighted. In this section A, however, the segment driving signal COM to be output from the segment driver is maintained at a high level, and the segments $S_{COM}$ do not give any indication, because the switch circuit 6 is in an open condition while the numerical place driving signal $T_8$ is at a low level, and the voltage $e_b$ is equal to the battery voltage E, which value is sufficiently higher than the reference voltage $e_s$. When the numerical place driving signal $T_8$ takes a high level, the switch circuit 6 is put in a conductive condition, and the current is conducted into the battery 5 through the resistors RA and RB. The voltage $e_b$ is represented by $E \cdot RB/(RA+RB)$. When the battery voltage is at its full level, the voltage $e_b$ is higher than the reference voltage $e_s$, so that the output signal Vo from the voltage comparator 7 is kept at a low level with no relation to the numerical place driving signal, and the segment driving signals COM for the segments $S_{COM}$ are also kept in the non-lighting condition, hence no display is produced. This condition is equal to what is seen in FIG. 3A.

Next, the section B shows a condition the which is represented as that shown in FIG. 3B, wherein only the segments $S_{COM}$ for the eighth numerical place in the display device are lighted. That is to say, while the numerical place driving signal $T_8$ is at a low level, the voltage $e_b$ is equal to the battery voltage E which is higher than the reference voltage $e_s$ at that time. However, when the numerical place driving signal $T_8$ takes a high level, the switch circuit 6 becomes conductive with the result that the voltage $e_b = E \cdot RB/(RA+RB)$ goes down. If the voltage $e_b$ is lower than the reference voltage $e_s$ at this time, the output signal Vo from the voltage comparator 7 takes a high level, and the segment driving signal COM is ready for lighting. To say it in other way, the segment driving signal COM is put in a condition of being able to be lighted in this section B only while the numerical place driving signal $T_8$ is kept at a high level, so that the segments $S_{COM}$ at the eighth place alone are displayed.

Next, the section C shows a condition where the battery voltage has become low to be no longer able to produce a desired voltage, i.e., a condition as in FIG. 3C. In this particular section, the battery voltage is already lower than the reference voltage $e_s$, even at a time other than when the numerical place driving signal $T_8$ appears, i.e., a time when the switch circuit 6 is in an open condition and the battery voltage E has come out on the voltage $e_b$; the output signal Vo from the voltage comparator is produced at a high level from the start; and the voltage $e_b$ further goes down while the numerical place driving signal $T_8$ is at a high level and the switch circuit 6 is in conduction. As the result of this, the output Vo from the voltage comparator 7 is kept at a high level. For that reason, the segment drive signal COM which is an output from the segment driver 8 goes on being in a condition of a low signal level, and responds to the numerical place driving signals $T_1$ to $T_8$ for the all places, thereby lighting the segments $S_{COM}$ for all numerical places.

Although explanations have been made in the foregoing as to the preferred embodiment of the present invention using an LED display device, it should be noted that a liquid crystal display device can also be used.

As stated in the foregoing, the present invention is able to provide the a battery voltage detecting device which is capable of detecting a voltage condition in a battery with a simple circuit construction by use of at least one drive signal out of time-division signals to drive the numerical places without giving unnecessary loads to the control circuits, etc., of the electronic apparatus and appliance such as electronic desk calculator etc.

What I claim is:

1. A battery voltage detector powered by a source battery, comprising:
   (a) display means having a plurality of segments;
   (b) time-division signal output means for putting out time-division signals for driving said plurality of segments in said display means in a time-division mode;
   (c) voltage detecting means for detecting the voltage of the source battery in response to said time-division signals output from said time-division signal output means;
   (d) means for producing a reference voltage;
   (e) voltage comparison means for comparing the battery voltage as detected by said voltage detecting means with said reference voltage; and
   (f) segment driving means for driving at least one segment preselected from said plurality of segments based on the result of said comparison by said voltage comparison means.

2. The battery voltage detector as set forth in claim 1, wherein said display means comprises an LED display device having a plurality of numerical places.

3. The battery voltage detector as set forth in claim 1, wherein said voltage detecting means comprises switching means which responds to said time-division signals, and load means which detects a voltage of said battery by applying thereto electric current supplied from said battery by switching operation of said switching means.

4. The battery voltage detector as set forth in claim 3, wherein said load means comprises resistors connected to said switching means and said battery.

5. A battery voltage detector powered by a source battery, comprising:
   (a) means for generating time-division driving signals;
   (b) display means including indicia for displaying information in a time-division mode in response to said time-division driving signals;
   (c) voltage detecting means for detecting the voltage of the source battery in response to one of said time-division driving signals;
   (d) means for generating a reference voltage;
   (e) voltage comparison means for comparing a voltage value detected by said voltage detecting means with said reference voltage; and
   (f) driving means for driving preselected indicia in said display means based on the result of comparison by said voltage comparison means.

6. The battery voltage detector as set forth in claim 5, wherein said display means has a plurality of indicia for displaying information.

7. The battery voltage detector as set forth in claim 5, wherein said voltage detecting means comprises switching means which responds to said time-division signals, and load means which detects a voltage of said battery by applying thereto electric current supplied from said battery by switching operation of said switching means.

8. The battery voltage detector as set forth in claim 7, wherein said voltage load means comprises resistors connected to said switching means and said battery.

9. A battery voltage detector powered by a source battery, comprising:
   (a) display means comprising display elements for a plurality of numerical places;
   (b) a display control circuit for putting out driving signals for driving said display elements in said display means and for putting out time-division signals for driving numerical places in said display means;
   (c) voltage detecting means for detecting a voltage of a power source battery in response to said time-division signals; and
   (d) driving means for driving pre-selected display elements in said display means in accordance with a voltage detected by said voltage detecting means.

10. A battery voltage detector powered by a source battery, comprising:
    (a) display means comprising a plurality of display segments;
    (b) time-division signal output means for putting out time-division signals for driving said display means;
    (c) voltage detecting means for detecting a voltage of the source battery in response to at least one-time division signal of said time-division signals; and
    (d) display driving means for driving pre-selected segments of said plurality of segments of said display means in accordance with the voltage detected by said voltage detecting means.

11. A battery voltage detector powered by a source battery, comprising:
    a display device having segments for displaying input data and processed data, and segments for displaying particular data other than input data and processed data;
    time-division signal output means for producing time-division signals for driving said segments of said display device in a time-division mode;
    switching means operable in response to a time-division signal from said time-division signal output means;
    load means for conducting an electric current from the source battery by switching operation of said switching means;
    means for producing a reference voltage;
    voltage comparison means for comparing a voltage applied to said load means with said reference voltage; and
    segment driving means for driving at least one preselected segment of said segments of said display device based on the result of comparison by said voltage comparison means.

12. The battery voltage detector as set forth in claim 11, wherein said load means comprises resistors connected to said switching means and said battery.

13. A battery voltage detector powered by a battery, comprising:
    means for producing a time-division driving signal;

a display device having a plurality of segments for displaying information in a time-division mode in response to the time-division driving signal;

switching means operable in response to said time-division driving signal;

load means for applying an electric current supplied from said battery by switching operation of said switching means;

means for producing a reference voltage;

voltage comparison means for comparing a voltage applied to said load means with said reference voltage; and segment driving means for driving at least one preselected segment of said plurality of segments based on the result of comparison by said voltage comparison means.

14. The battery voltage detector as set forth in claim 13, wherein said load means comprises resistors connected to said switching means and said battery.

15. A battery voltage detector powered by an electric source voltage, comprising:

display means having a plurality of segments;

means for producing a time-division signal for driving said plurality of segments of said display means;

switching means operable in response to said time-division signal;

load means for conducting an electric current when the electric source voltage is applied to said load means by said switching means;

means for producing a reference voltage;

comparison means for comparing one of a voltage drop by said load means and said electric source voltage with said reference voltage; and segment driving means for driving at least one selected segment from among said plurality of segments based on the result of comparison by said comparison means.

16. The battery voltage detector as set forth in claim 15, wherein said at least one segment to be driven from among said plurality of segments is different from others of said plurality of segments on the basis of the result of comparison of said voltage drop and said reference voltage and the result of comparison of said electric source voltage and said reference voltage.

17. A battery voltage detector powered by an electric source voltage, comprising:

means for producing a signal;

switching means operable in response to said signal for applying said electric source voltage;

load means for conducting an electric current when the electric source voltage is applied by said switching means;

means for producing a reference voltage;

comparison means for comparing one of a voltage drop by said load means and said electric source voltage with a reference voltage; and display means having a plurality of segments for displaying the result of comparison by said comparison means.

* * * * *